United States Patent
Chang et al.

(10) Patent No.: US 7,142,569 B2
(45) Date of Patent: Nov. 28, 2006

(54) TUNABLE LASER SOURCE AND WAVELENGTH SELECTION METHOD THEREOF

(75) Inventors: Sean Chang, Taoyuan (TW); Chia-chi Wu, Taipei County (TW)

(73) Assignee: Delta Electronics, Inc., Taoyuan County (TW)

( * ) Notice: Subject to any disclaimer, the term of this patent is extended or adjusted under 35 U.S.C. 154(b) by 266 days.

(21) Appl. No.: 10/818,723

(22) Filed: Apr. 6, 2004

(65) Prior Publication Data

US 2004/0264515 A1   Dec. 30, 2004

(30) Foreign Application Priority Data

Jun. 30, 2003   (TW) ............................... 92117770 A

(51) Int. Cl.
*H01S 3/10* (2006.01)
*H01S 3/08* (2006.01)

(52) U.S. Cl. .......................................... 372/20; 372/99

(58) Field of Classification Search ................ 372/20, 372/98, 99
See application file for complete search history.

(56) References Cited

U.S. PATENT DOCUMENTS 4,287,486 A * 9/1981 Javan ............................. 372/20
5,524,012 A   6/1996 Wang et al. .................... 372/23
6,671,295 B1 * 12/2003 Gutin ........................... 372/20
2001/0010599 A1 * 8/2001 Lefevre ........................ 359/633

FOREIGN PATENT DOCUMENTS

CN           1477742 A           2/2004

OTHER PUBLICATIONS

Chi-Luen Wang et al., Tunable Dual-Wavelength Operation of a Diode Array With an External Grating-Loaded Cavity, Applied Physics Letters, vol. 64, No. 23, Jun. 6, 1994, pp. 3089-3091.*
Boggs et al., "Simple High-Coherence Rapidly Tunable External-Cavity Diode Laser", Optics Letters, vol. 23, No. 24, 1906-1908, Dec. 15, 1998, by Optical Society of America.

* cited by examiner

*Primary Examiner*—James Menefee
(74) *Attorney, Agent, or Firm*—Pai Patent & Trademark Law Firm; Chao-Chang David Pai

(57) ABSTRACT

A tunable laser source includes a gain chip, a collimating lens, a grating, a focusing lens and a wavelength selection device. The grating is positioned to be impinged by the collimated light to provide diffracted beams at different diffraction angles whose wavelengths disperse in accordance with the diffraction angles. Those diffracted beams are then brought to separate focal points on the wavelength selection device through the focusing lens. The wavelength selection device includes a light shield with a single slit formed thereon and a mirror. The single silt allows the mirror to reflect only one diffracted beam back to the gain chip so as to maintain the oscillation of the tunable laser source at the wavelength corresponding to the diffraction angle of the only one focused diffracted beam.

21 Claims, 4 Drawing Sheets

TUNABLE LASER SOURCE AND WAVELENGTH SELECTION METHOD THEREOF

BACKGROUND OF THE INVENTION

1. Field of the Invention

The invention relates to a tunable laser source and, more particularly, to a tunable laser source that utilizes a wavelength selection device to select a desired wavelength for the tunable laser source.

2. Description of the Related Art

Recently, a variety of techniques have been applied to tune diode lasers. For instance, U.S. Pat. No. 5,319,668 discloses a tunable diode laser with a diffraction grating and a rotatable mirror for wavelength selection. Referring to FIG. 1, such tunable diode laser 100 includes a solid state diode laser 102, a collimating lens 104, a grating 106 and a rotatable mirror 108. The light emitted from the solid state diode laser 102 passes through the collimating lens 104, and the collimated light illuminates the grating 106 at a grazing angle such that a first-order diffraction beam 110 emerges from the grating 106. The first-order diffraction beam 110 then strikes the mirror 108 to provide a return beam to the solid state diode laser 102 and to cause oscillation at a wavelength determined by the diffraction angle of the first-order diffraction beam 110 perpendicular to the mirror 108. Hence, the output wavelength of the tunable diode laser 100 can be tuned by adjusting the inclination of the mirror 108.

However, such configuration often needs a complex rotation mechanism, and the dimensions from the pivot of the rotation mechanism to the collimating lens 104 and the mirror 108 require high precision, which is difficult to ensure under temperature variations. Also, because the mirror must be wide enough to intercept all diffracted beams, it is difficult to minimize the size of the rotation mechanism and thus difficult to increase its modulation speed, which is needed by broadband wavelength tuning.

BRIEF SUMMARY OF THE INVENTION

Therefore, an object of the invention is to provide a tunable laser source that utilizes a wavelength selection device to select the desired wavelength with short switching time.

According to the invention, a tunable laser source includes a gain chip, a collimating lens, a grating, a focusing lens and a wavelength selection device. The grating is positioned to be impinged by the collimated light to provide diffracted beams at different diffraction angles whose wavelengths disperse in accordance with the diffraction angles. Those diffracted beams are then, through the focusing lens, brought to a row of separate focal points on the wavelength selection device. The wavelength selection device includes a light shield with a single slit formed thereon and a mirror. When the light shield translates relative to the mirror, the single silt allows the mirror to reflect only one diffracted beam back to the gain chip so as to maintain the oscillation of the tunable laser source at the wavelength corresponding to the diffraction angle of the only one focused diffracted beam.

Through the design of the invention, because the desired wavelength is selected by the translational movement of the light shield, the tunable laser source requires no rotation mechanism; therefore, it is effectively minimized in size and can provide a desired output wavelength with very short switching time.

Further, a compensating plate may be provided in the optical path between the collimating lens and the grating to adjust the optical path length between the gain chip and the wavelength selection device. The adjustment of the optical path length brought about by the compensating plate can make the response curve of the output light emission align exactly with the International Telecommunication Union grid (ITU grid) spectral pattern, thereby achieving a high modulation speed and efficient data transmission.

DETAILED DESCRIPTION OF THE INVENTION

Figure 1:
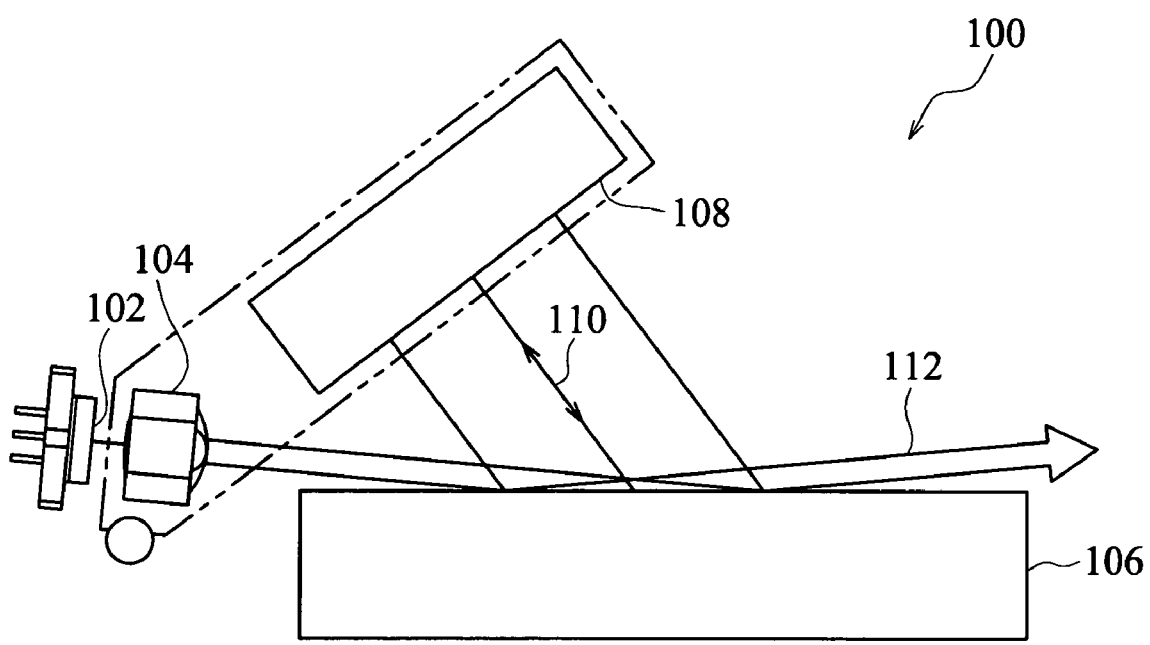
FIG. 1 is a schematic view showing a conventional tunable diode laser.
Figure 2:
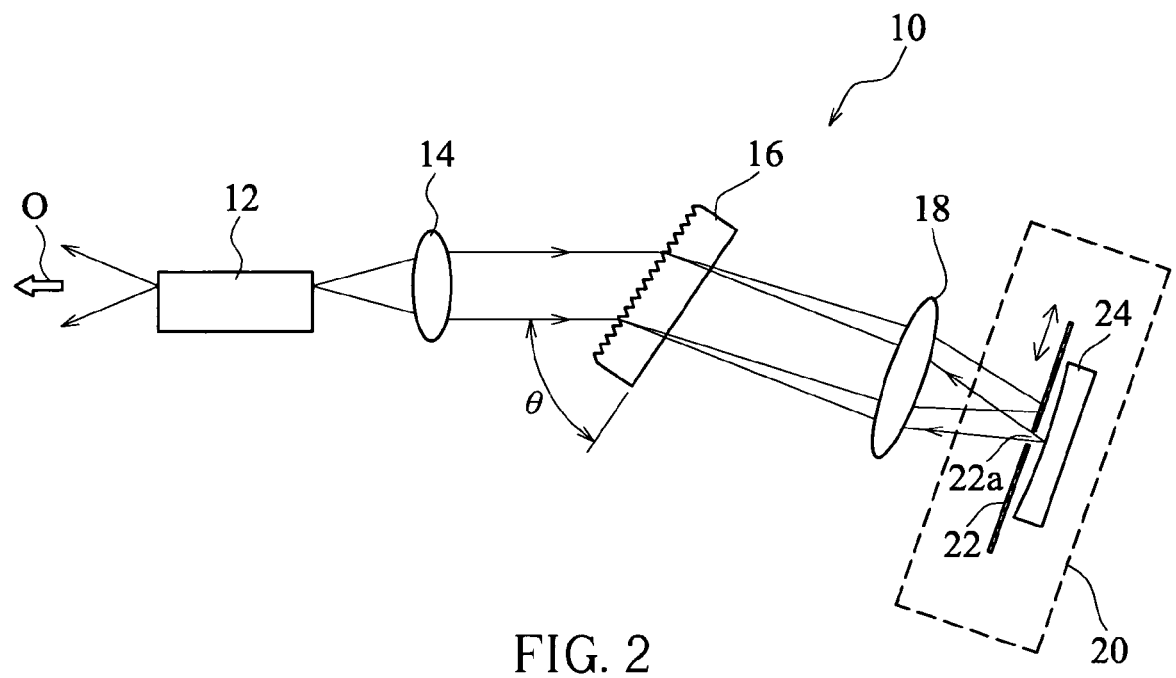
FIG. 2 is a schematic view showing a tunable laser source according to an embodiment of the invention.

Referring to FIG. 2, there is shown a tunable laser source 10 including a gain chip 12, a collimating lens 14, a transmission grating 16, a focusing lens 18 and a wavelength selection device 20. The wavelength selection device 20 includes a light shield 22 formed with a slit 22a thereon and a mirror 24.

Figure 3:
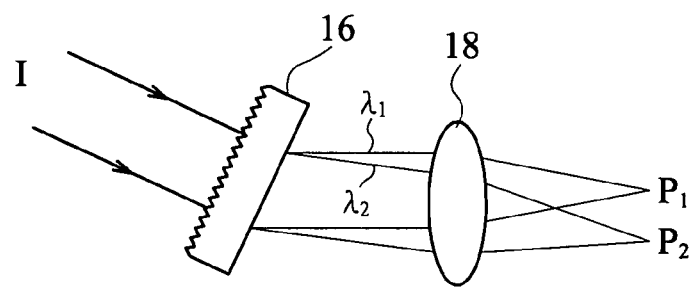
FIG. 3 is a schematic view showing the wavelength separation achieved by a transmission grating in conjunction with a focusing lens.

FIG. 3 illustrates the wavelength separation achieved by a transmission grating 16 in conjunction with a focusing lens 18. Referring to FIG. 3, when light strikes the transmission grating 16, the light is angularly separated in space since different wavelengths are diffracted at different diffraction angles. After passing through the focusing lens 18 whose position relative to the transmission grating 16 is properly arranged, the separate beams with distinct wavelengths, such as $\lambda_1$ and $\lambda_2$ shown in FIG. 3, are individually brought to focal points such as $P_1$ and $P_2$. That is, the diffracted beams, with their wavelengths dispersing in accordance with the diffraction angles, are transformed to a row of separate focal points through the focusing lens.

Referring now to FIG. 2, light emitted from one side of the gain chip 12 is collimated by the collimating lens 14, and the collimated light further strikes the transmission grating 16 at an angle $\theta$. The transmission grating 16, positioned in front of the gain chip 12 and collimating lens 14, diffracts the collimated light into broadband diffracted beams at different diffraction angles. The diffracted beams, whose wavelengths disperse in accordance with the diffraction angles, are brought to a row of separate focal points through the focusing lens 18 and further enter the wavelength selection device 20.

The wavelength selection device 20 consists of a mirror 24 positioned in the focal plane of the focusing lens 18 and a light shield 22 arranged between the focusing lens 18 and the mirror 24. The diffracted beams are focused on the focal plane where the mirror 24 is positioned, and the light shield 22 translates relative to the row of separate focal points projected on the mirror plane.

The slit 22a formed on the light shield 22 is designed to allow only one focused diffracted beam to pass through. Thereby, when the slit 22a moves to select one focused diffracted beam as the light shield 22 translates relative to the mirror 24, only one focused diffracted beam with a selected wavelength is reflected back to the gain chip 12. Hence, the only one focused diffracted beam with the selected wavelength is provided for the gain chip 12 to promote amplification, and, once amplified, only that wavelength selected by the wavelength selection device 20 survives, and the tunable laser source 10 that provides a narrow band laser output O lases at that selected wavelength as a result.

Through the design of the invention, because the desired wavelength is selected by the translational movement of the light shield 22, the tunable laser source 10 requires no rotation mechanism, therefore it is effectively minimized in size and can provide the desired output wavelength with short switching time.

The light shield 22 is used to eliminate unselected wavelengths and allow the selected wavelength to pass through the silt 22a; it is not limited to any shape or material. Preferably, the light shield 22, especially the surface portion thereof, is made from a light-scattering or light-absorbing material to avoid the formation of stray light caused by the unselected diffracted beams. For example, the light shield 22 can be constructed by first treating an optical plate with a coating of light-scattering or light-absorbing materials and then slicing it to form an aperture of a narrow width thereon. The aperture may be filled with a transparent material.

The translational movement of the light shield 22 may be induced by a piezoelectric actuator, a pneumatic actuator, or a micro actuator manufactured by micro-electro-mechanical system (MEMS) technologies. Preferably, the light shield 22 is induced by a micro actuator manufactured by MEMS technologies since the micro actuator is small in size and has precision within one millisecond.

Further, the width of the slit is so selected as to have sufficient spectral purity for the output beam and a sufficient power level necessary to sustain the oscillation of the tunable laser source 10.

Figure 4:
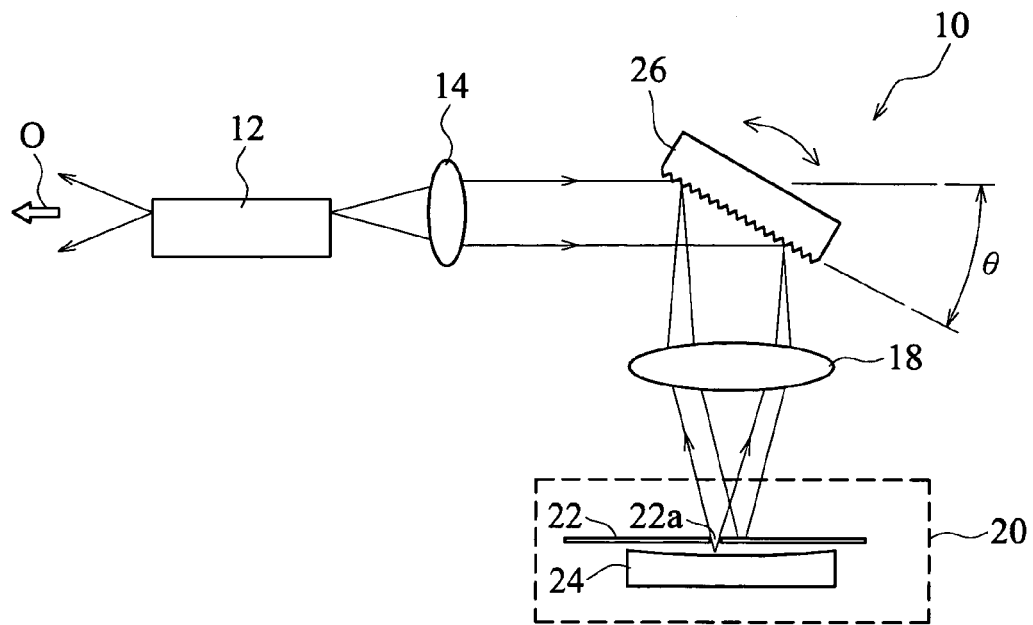
FIG. 4 is a schematic view showing a modification of the tunable laser source shown in FIG. 2.

Referring to FIG. 4, a reflection grating 26 is used in the tunable laser source 10 instead of a transmission grating, with the focusing lens 18 and the wavelength selection device 20 properly arranged in a new optical path. Further, the wavelength selection can be achieved by designing the grating to be rotatable while the light shield 22 remains stationary. As the grating rotates to adjust its inclination, the angle θ made with the collimated light varies, and the output wavelength is determined by which focused diffracted beam the slit 22a traps.

From the above, it can be comprehended that the wavelength selection can also be achieved as the grating rotates and the light shield translates relative to the mirror at the same time. In that case, the modulation speed of the tunable laser source can be increased more effectively.

In the field of optical fiber communication, it is necessary that tunable optical components conform to the same standard grid, such as the International Telecommunication Union grid (ITU grid), in order to ensure the wavelength compatibility. Hence, if the tunable laser source 10 directly outputs light emission with a wavelength conforming to the ITU grid without the need of further tuning steps, a high modulation speed and efficient data transmission can be achieved.

Figure 5:
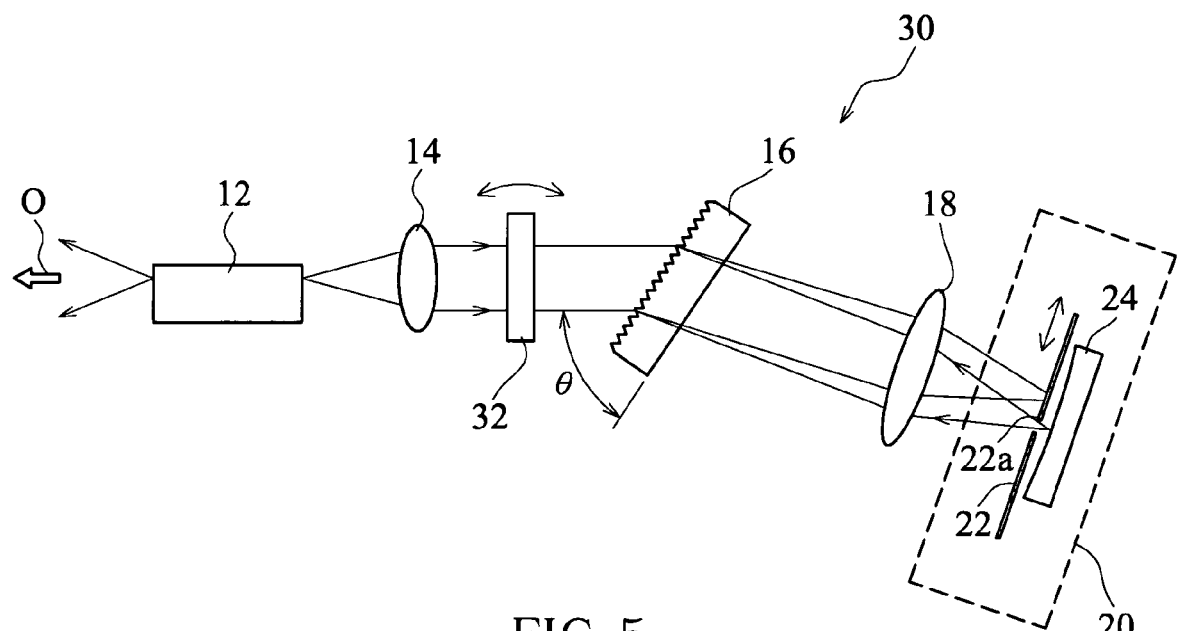
FIG. 5 is a schematic view showing a tunable laser source according to another embodiment of the invention.

Referring now to FIG. 5, another embodiment according to the invention includes a compensating plate 32 provided in the optical path between the collimating lens 14 and the transmission grating 16. The compensating plate 32, such as a transparent glass plate, is rotated to change the angle made with the collimated light in order to adjust the length of the optical path through which the diffracted beam selected by the slit travels. Therefore, since the optical path length of the external cavity between the gain chip 12 and the wavelength selection device 20 is fine tuned by the rotation of the compensating plate 32, the tunable laser source 30 can directly output light emission with a wavelength conforming to the ITU grid. That is, the adjustment of the optical path length brought about by the rotation of the compensating plate 32 can make the response curve of the output light emission align exactly with the ITU grid spectral pattern, thereby achieving a high modulation speed and efficient data transmission.

Figure 6:
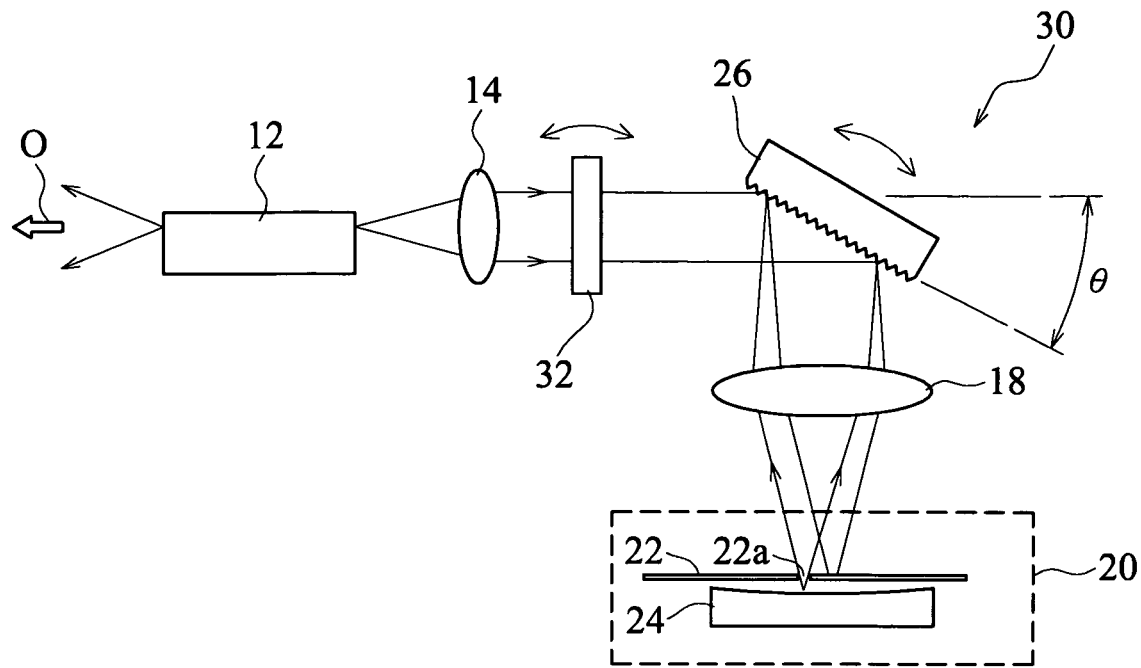
FIG. 6 is a schematic view showing a modification of the tunable laser source shown in FIG. 5.

Referring to FIG. 6, a reflection grating 26 is used in the tunable laser source 30 instead of a transmission grating, with the focusing lens 18 and the wavelength selection device 20 properly arranged in a new optical path, and the compensating plate 32 is provided in the optical path between the collimating lens 14 and the grating 26. Further, the wavelength selection can be achieved by designing the grating to be rotatable while the light shield 22 remains stationary. As the grating rotates to adjust its inclination, the angle θ made with the collimated light varies, and the output wavelength is determined by which focused diffracted beam the slit 22a traps.

Figure 7:
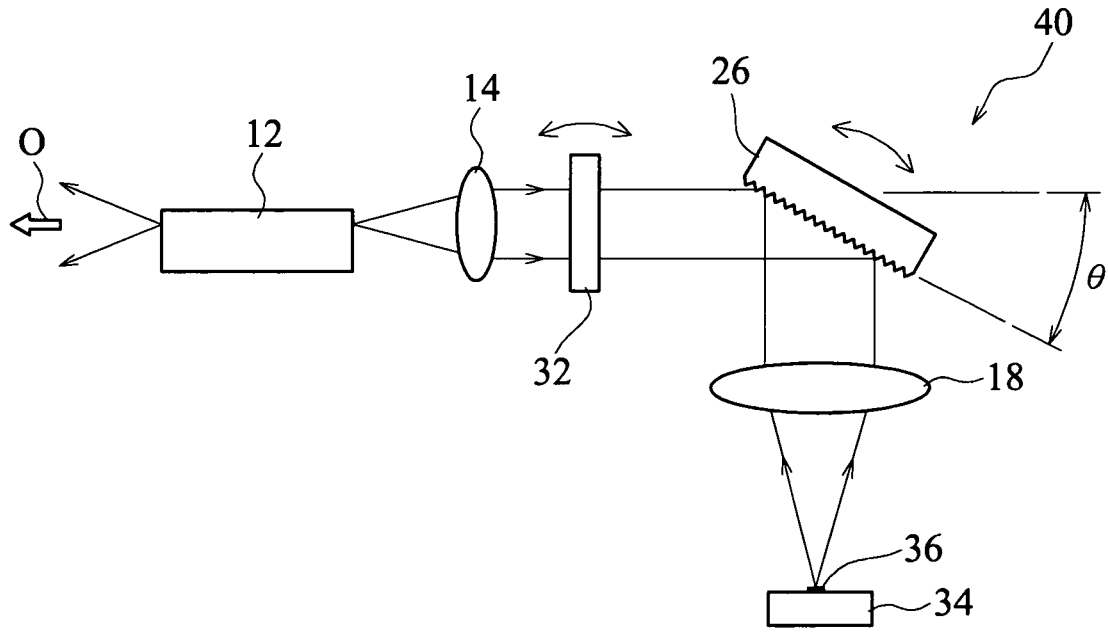
FIG. 7 is a schematic view showing a tunable laser source according to another embodiment of the invention.

Referring to FIG. 7, there is shown a tunable laser source 40 according to another embodiment of the invention, where a wavelength selection device is constructed by a substrate 34 having a single reflective stripe 36 formed on its surface. The single reflective stripe 36 is used to reflect back one selected focused diffracted beam to the gain chip 12, either by means of the rotation of the grating 26 or the translational movement of the substrate 34, so that the tunable laser source 40 lases at such selected wavelength.

The substrate 34 is not limited to any shape or material. Preferably, the substrate 34, especially the surface portion thereof, is made from a light-scattering or light-absorbing material. Also, in this embodiment a compensating plate is selectively incorporated in the tunable laser source 40 to allow the response curve of output light emission to align exactly with the ITU grid spectral pattern.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A tunable laser source comprising:
   a gain chip;
   a collimating lens for collimating light emitted from the gain chip;
   a grating positioned for diffracting the collimated light to provide diffracted beams at different angles;
   a focusing lens for bringing the diffracted beams to a row of separate focal points; and
   a wavelength selection device positioned in the focal plane of the focusing lens to allow one focused diffracted beam to be reflected back to the gain chip so as to direct the focused diffracted beam outputted from the gain chip and to maintain the oscillation of the tunable laser source at the wavelength corresponding to the diffraction angle of the focused diffracted beam.

2. The tunable laser source as recited in claim 1, wherein the grating is a transmission grating or a reflection grating.

3. The tunable laser source as recited in claim 1, wherein the wavelength selection device comprises:
   a mirror positioned in the focal plane of the focusing lens; and
   a light shield arranged between the focusing lens and the mirror and having a slit for allowing the focused diffracted beam to pass through.

4. The tunable laser source as recited in claim 3, wherein the light shield is an optical plate with a coating of light-scattering or light absorbing material, and the slit is formed by forming an aperture of a narrow width on the light shield and filling a transparent material in the aperture.

5. The tunable laser source as recited in claim 3, wherein the light shield is movable via a piezoelectric actuator, a pneumatic actuator or a micro actuator manufactured by micro-electro-mechanical system technology.

6. The tunable laser source as recited in claim 1, further comprising a compensating plate positioned between the collimating lens and the grating for changing an angle of the collimated light.

7. The tunable laser source as recited in claim 6, wherein the compensating plate is a rotatable transparent glass plate.

8. The tunable laser source as recited in claim 1, wherein the wavelength selection device comprises a substrate having a reflective stripe formed on a surface thereof.

9. The tunable laser source as recited in claim 8, wherein the substrate has a coating of a light-scattering or light-absorbing material on a surface portion thereof.

10. The tunable laser source as recited in claim 1, wherein the grating is a rotatable grating.

11. A tunable laser source comprising:
    a gain chip;
    a collimating lens for collimating light emitted from the gain chip;
    a grating positioned to be impinged by the collimated light from the collimating lens to provide diffracted beams at different diffraction angles whose wavelengths disperse in accordance with the diffraction angles;
    a focusing lens for bringing the diffracted beams to a row of separate focal points; and
    a wavelength selection device comprising a light shield and a mirror positioned in the focal plane of the focusing lens, wherein the light shield has a slit thereon and translates relative to the mirror to allow one focused diffracted beam to pass through, and the focused diffracted beam is further reflected by the mirror back to the gain chip so as to direct the focused diffracted beam outputted from the gain chip and to maintain the oscillation of the tunable laser source at the wavelength corresponding to the diffraction angle of the focused diffracted beam.

12. The tunable laser source as recited in claim 11, further comprising a compensating plate positioned between the collimating lens and the grating to adjust the optical path length between the gain chip and the wavelength selection device.

13. The tunable laser source as recited in claim 12, wherein the compensating plate is a transparent glass plate.

14. The tunable laser source as recited in claim 11, wherein a surface portion of the light shield is made from a light-absorbing material or a light-scattering material.

15. The tunable laser source as recited in claim 11, wherein the silt is filled with a transparent material.

16. The tunable laser source as recited in claim 11, wherein the grating is a transmission grating or a reflection grating.

17. A tunable laser source comprising:
    a gain chip;
    a collimating lens for collimating light emitted from the gain chip;
    a grating positioned to be impinged by the collimated light from the collimating lens to provide diffracted beams at different diffraction angles whose wavelengths disperse in accordance with the diffraction angles;
    a focusing lens for bringing the diffracted beams to a row of separate focal points; and
    a wavelength selection device comprising a substrate having a reflective stripe formed on its surface, wherein the reflective stripe is positioned in the focal plane of the focusing lens and the reflective stripe reflects one focused diffracted beam back to the gain chip so as to direct the focused diffracted beam outputted from the gain chip and to maintain the oscillation of the tunable laser source at the wavelength corresponding to the diffraction angle of the focused diffracted beam.

18. The tunable laser source as recited in claim 17, further comprising a compensating plate positioned between the collimating lens and the grating to adjust the optical path length between the gain chip and the wavelength selection device.

19. The tunable laser source as recited in claim 18, wherein the compensating plate is a transparent glass plate.

20. The tunable laser source as recited in claim 17, wherein a surface portion of the substrate is made from a light-absorbing material or a light-scattering material.

21. The tunable laser source as recited in claim 17, wherein the grating is a transmission grating or a reflection grating.

* * * * *